United States Patent [19]
Wollenberg

[11] Patent Number: 6,039,855
[45] Date of Patent: Mar. 21, 2000

[54] TARGET FOR THE SPUTTERING CATHODE OF A VACUUM COATING APPARATUS AND METHOD FOR ITS MANUFACTURE

[75] Inventor: Norbert Wollenberg, Grosskrotzenburg, Germany

[73] Assignee: Leybold Materials GmbH, Hanau, Germany

[21] Appl. No.: 08/719,614

[22] Filed: Sep. 25, 1996

[30] Foreign Application Priority Data

Sep. 27, 1995 [DE] Germany .......................... 195 35 894

[51] Int. Cl.[7] .................................................. C23C 14/34
[52] U.S. Cl. ................................ 204/298.12; 204/298.13
[58] Field of Search ........................ 204/192.12, 298.12, 204/298.13

[56] References Cited

U.S. PATENT DOCUMENTS

| | | | |
|---|---|---|---|
| 4,405,436 | 9/1983 | Kobayashi et al. ...................... | 204/298 |
| 4,668,373 | 5/1987 | Rille et al. ................................ | 204/298 |
| 4,982,269 | 1/1991 | Calligaro .................................. | 357/56 |
| 4,983,269 | 1/1991 | Wegmann ............................ | 204/192.13 |
| 5,334,298 | 8/1994 | Gegenwart ........................... | 204/192.12 |

FOREIGN PATENT DOCUMENTS

| | | |
|---|---|---|
| 393344 | 3/1990 | European Pat. Off. . |
| 3603646 | 10/1986 | Germany . |
| 4436176 | 4/1995 | Germany . |
| 2267261 | 1/1991 | Japan . |

*Primary Examiner*—Rodney McDonald
*Attorney, Agent, or Firm*—Fulbright & Jaworski, LLP

[57] ABSTRACT

A frame (3, 4, 5, . . . 7) at least partially surrounds the target material (19), and serves to mount the target on the cathode backing plate (9), with a separating film or interlayer (20) of soft material disposed between the frame and the cathode backing plate. The frame (3, 4, 5, . . . 7) is provided with a plurality of projections (3a, 3b, . . . 4a, 4b, . . . 7a, 7b . . . ) affixed to the frame members (3, 4, 5, . . . 7) and extending into the target material in order to hold the target material (19) in the spaces (A, B, C) surrounded by the frame members. The target is preferably cast directly into the frame while the frame is fixed to a stainless steel plate, then removed together with the frame after cooling and mounted to the cathode plate.

5 Claims, 2 Drawing Sheets

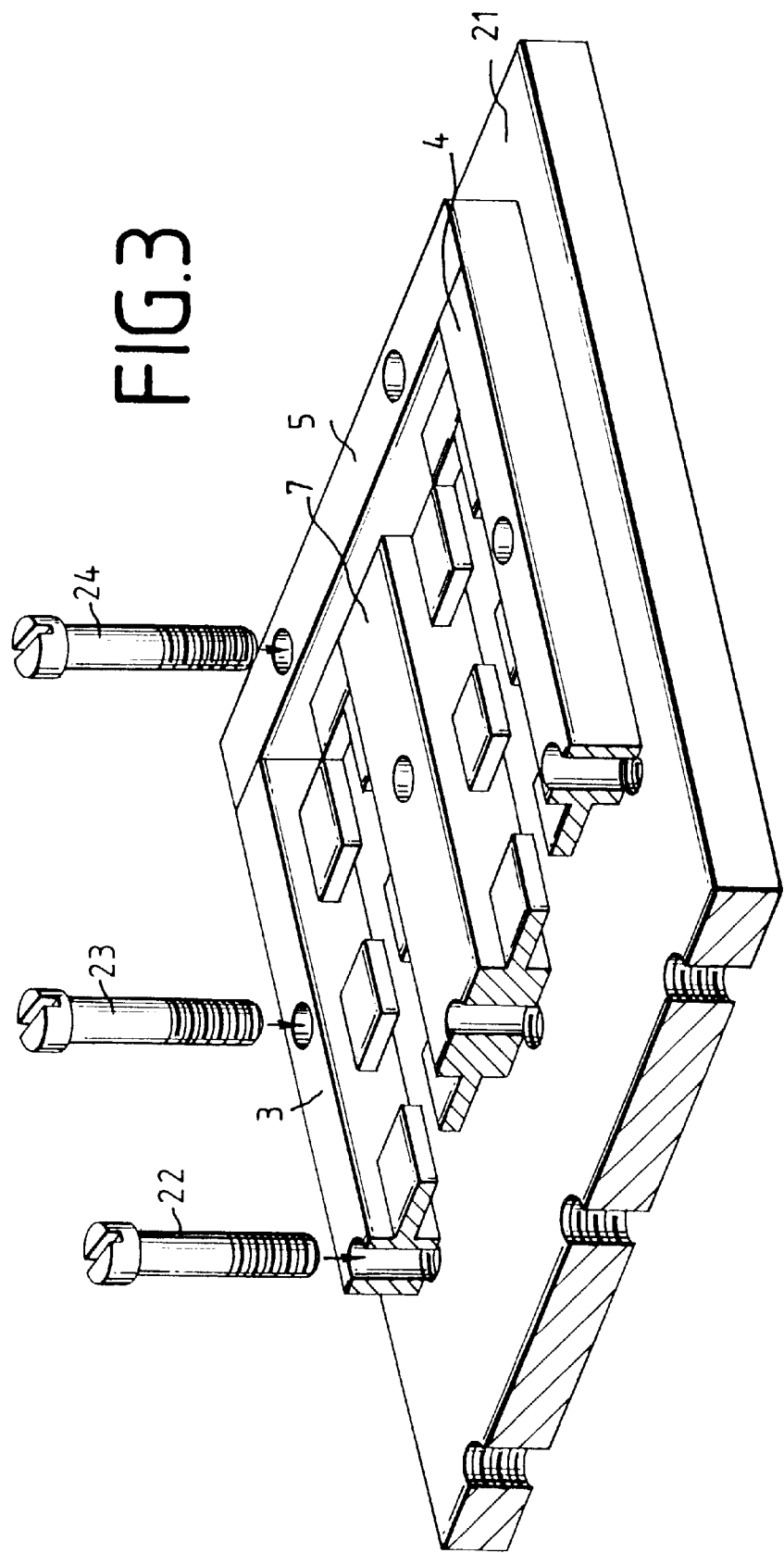

TARGET FOR THE SPUTTERING CATHODE OF A VACUUM COATING APPARATUS AND METHOD FOR ITS MANUFACTURE

BACKGROUND OF THE INVENTION

The invention relates to a target for the sputtering cathode of a vacuum coating apparatus, having a frame at least partially surrounding the sputter material for the purpose of holding the plate-like target on the cathode plate or back plate, and having an intermediate layer of soft material having good thermal conductivity, and a method for its manufacture.

In order to achieve better cooling in the cathode sputtering of the target, DE-A-36 03 646 discloses use of clamps or prongs to fix a plate-like target on the cathode base plate, which is generally provided with water cooling.

U.S. Pat. No. 5,334,298 discloses a target arrangement for a cathode sputtering apparatus having an enclosed cathode configuration, with a target body which can be coupled by a releasable fastening means to a cooling system, a separating membrane being provided between the target body and the cooling system, which is connected on the one hand to the cooling system and on the other hand to the target body by separate fastening means.

U.S. Pat. No. 5,334,298 also discloses a sputtering cathode which operates on the magnetron principle, having a cathode body which is equipped with a sputtering surface, and a target having a circumferential surface. Behind the target there is provided a magnet system with poles of opposite polarity lying within one another for the production of magnetic lines of force which issue from the target and, after passing through arcuate paths, re-enter the target. The marginal areas of the target lying outside of the erosion zone sputtering surface are covered by a prolongation of the dark space shield running parallel to the sputtering surface and having an inner margin. The dark space shield is electrically floating and is separated from the target by a gap which is so great that no plasma can ignite between the target and the dark space shield, so that only the exposed target is sputtered.

SUMMARY OF THE INVENTION

The object of the present invention is to provide a target of special magnitude which will be suitable for coating substrates of large area, e.g., windowpanes, yet will be economical to produce. Especially, the exhausted target is to be recyclable at comparatively small expense and permit an especially quick mounting on and dismounting from the cathode.

According to the invention the frame is provided with a plurality of pins, tongues or strip-like projections joined to the frame for holding the target material on the frame members and reaching from the frame in a plane parallel to the target plane. These studs, tongues or projections are surrounded by the target material and extend into the target material.

BRIEF DESCRIPTION OF THE DRAWINGS

FIG. 3 is a perspective cross-sectional view of the frame parts of the target which are affixed to a high-grade steel plate to be filled with target material.

DETAILED DESCRIPTION OF THE PREFERRED EMBODIMENTS

Figure 1:
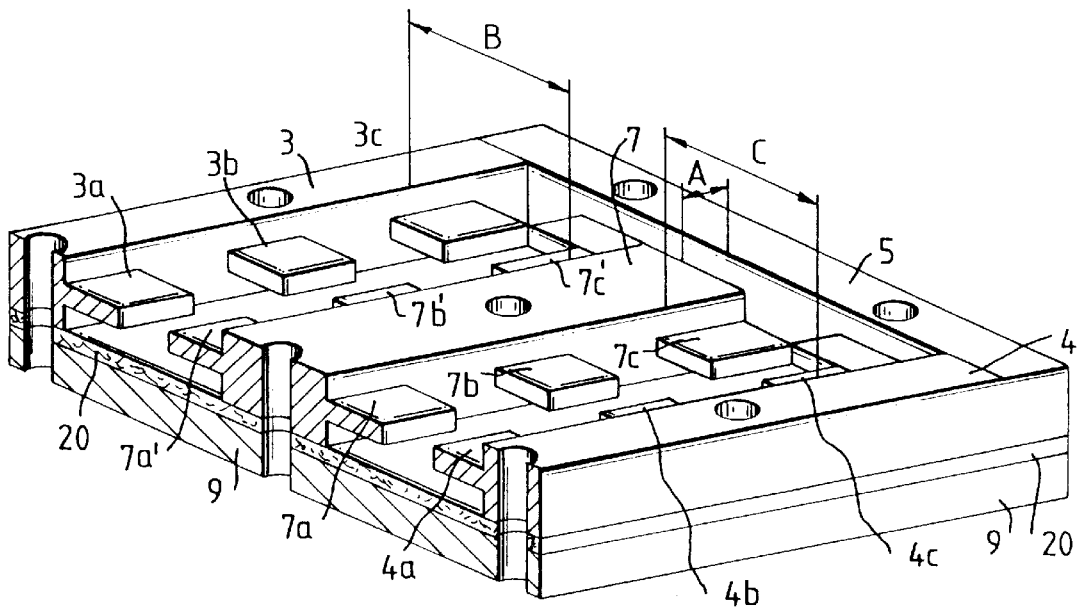
FIG. 1 is a perspective cross-sectional view of the end piece of a frame.
Figure 2:
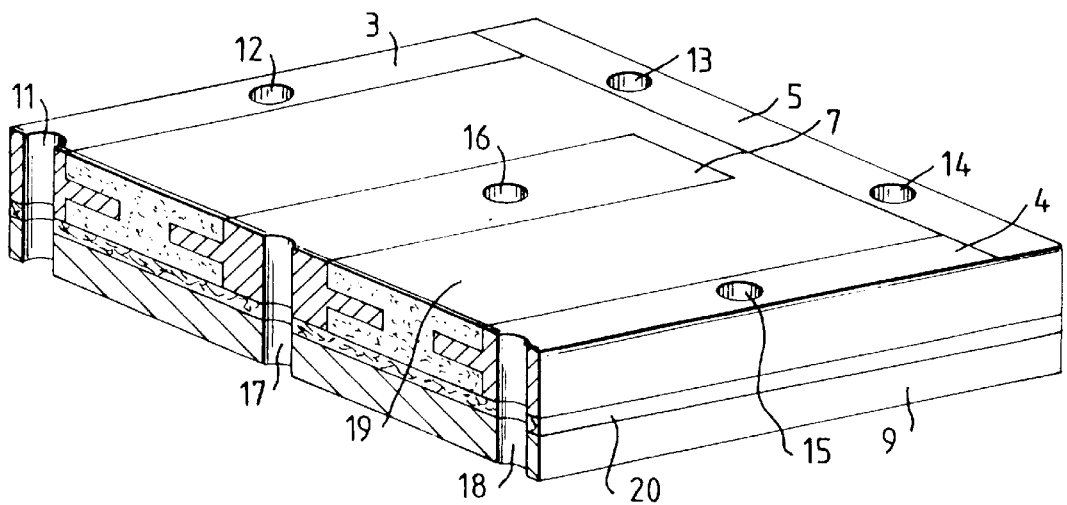
FIG. 2 is a perspective cross-sectional view of the end piece of FIG. 1, but filled with the target material.

The target includes four frame members 3, 4, 5, . . . which together form an elongated, rectangular frame, plus a center member 7 which extends parallel to the two side members 3 and 4 and forms the gaps A, . . . with the two end members 5, . . . The side frame members 3 and 4, and also the two end members 5, . . . are each provided with laterally reaching projections or tongues 3a, 3b, . . . , 4a, 4b, . . . which extend into the spaces B and C formed by the middle member and the side members. The middle member 7 is also provided with tongues 7a, 7b, . . . and 7a', 7b' which reach into the spaces B and C. The target shown in FIG. 2 is screwed to the cathode plate 9, the frame members 3, 4, 5, . . . 7 being provided for this purpose with a plurality of bores. In order to improve the heat transfer from the target material filling the gaps A, B and C, . . . to the back plate and cathode base plate 9, a layer 20 of material of good thermal conductivity is inserted between the target material 19 and the frame members 3, 4, 5, . . . , 7. This layer 20 can be an indium-tin foil or a plastic foil.

For the production of the target, as shown in FIG. 3, first the frame members are screwed to the high-grade steel plate 21 by means of screws 22, 23, 24, . . . such that the frame members lie gap-free on the upper side of plate 21. Then the high-grade steel plate 21 and frame parts are heated to a temperature corresponding approximately to the melting temperature of the target material. Then the molten target material is poured in until it completely fills these gaps A, B, C. This material is usually tin but may also be zinc. After the casting and after the target material 19 and plate 21 have cooled, the screws 22, 23, 24, . . . can be removed and the frame together with the target material 19 can be lifted as a single compact unit from the plate 21 and then be screwed to the cathode base plate (as shown in FIG. 2) with the intermediate layer 20.

It is clear that the materials for the plate 21 and the frame members 3, 4, 5, . . . must be selected such that the target material 19 does not bond inseparably to the frame members and the plate 21. The frame members are preferably nickel plated copper.

I claim:

1. Sputter cathode arrangement with a back plate and a frame surrounding a target material to be sputtered having a target plane and a separating layer laid between the frame and the back plate, characterized by a plurality of tongues extending from the frame in a plane parallel to the target plane, extending a distance into the target material and affixed to the frame for mounting the target material cast into an interstitial space surrounded by the frame, the frame having an elongated, approximately rectangular configuration having two long frame side parts parallel to one another, with each having aq length and between the two long frame side parts parallel to one another there is provided a central bridge having a length extending alongside the two long frame side parts parallel to one another, the length of the bridge being shorter than the length of the two long frame side parts parallel to one another.

2. Sputter cathode arrangement as in claim 1 wherein said frame comprises a plurality of frame members.

3. Sputter cathode arrangement as in claim 2 wherein said frame members are screwed to the back plate to form said frame.

4. Sputter cathode arrangement as in claim 2 wherein said frame members are nickel plated.

5. Sputter cathode arrangement as in claim 2 wherein the frame members which form the frame further comprises the bridge dividing said target material into two distinct areas.

* * * * *